(12) United States Patent
Kolasinski et al.

(10) Patent No.: US 10,590,562 B2
(45) Date of Patent: Mar. 17, 2020

(54) REGENERATIVE ELECTROLESS ETCHING

(71) Applicant: West Chester University, West Chester, PA (US)

(72) Inventors: Kurt W Kolasinski, West Chester, PA (US); Jarno Salonen, Rusko (FI); Ermei Makila, Turku (FI)

(73) Assignee: West Chester University, West Chester, PA (US)

( * ) Notice: Subject to any disclaimer, the term of this patent is extended or adjusted under 35 U.S.C. 154(b) by 0 days.

(21) Appl. No.: 16/173,800

(22) Filed: Oct. 29, 2018

(65) Prior Publication Data

US 2019/0169766 A1 Jun. 6, 2019

Related U.S. Application Data

(60) Provisional application No. 62/595,116, filed on Dec. 6, 2017.

(51) Int. Cl.
*C25F 3/12* (2006.01)
*C01B 33/02* (2006.01)
(Continued)

(52) U.S. Cl.
CPC ............... *C25F 3/12* (2013.01); *C01B 33/02* (2013.01); *C23F 1/00* (2013.01);
(Continued)

(58) Field of Classification Search
CPC .................................. C25F 3/12; C23F 1/00
(Continued)

(56) References Cited

U.S. PATENT DOCUMENTS

| 9,184,438 B2 | 11/2015 | Green et al. |
| 2004/0166319 A1 | 8/2004 | Li et al. |

(Continued)

FOREIGN PATENT DOCUMENTS

| EP | 2321441 | 12/2016 |
| WO | 2007/037787 | 4/2007 |

OTHER PUBLICATIONS

Chadwick et al. "Compositional Characterisation of Metallurgical Grade Silicon and Porous Silicon Nanosponge Particles", RSC Advances, 3, 19393-19402, The Royal Society of Chemistry (2013).
(Continued)

*Primary Examiner* — Roberts P Culbert
(74) *Attorney, Agent, or Firm* — Stradley Ronon Stevens & Young, LLP (57) ABSTRACT

A regenerative electroless etching process produces nanostructured semiconductors in which an oxidant ($Ox_1$) is used as a catalytic agent to facilitate reaction between a semiconductor and a second oxidant ($Ox_2$) that would be unreactive (or slowly reactive compared to $Ox_1$) in the primary reaction. $Ox_2$ is used to regenerate $Ox_1$, which can initiate etching by injecting holes into the semiconductor valence band. The extent of reaction is controlled by the amount of $Ox_2$ added; the reaction rate, by the injection rate of $Ox_2$. This general strategy is demonstrated specifically to produce highly luminescent nanocrystalline porous, amorphous pillared, and hierarchical porous silicon from the reaction of $V_2O_5$ in HF(aq) as $Ox_1$ and $H_2O_2$(aq) as $Ox_2$ with a silicon-comprising substrate. The process can be performed on silicon-comprising substrates of arbitrary size and shape including powders, reclaimed shards, wafers, pillared silicon, porous silicon, and silicon nanowires. Luminescence is tuned by adjusting etching conditions.

20 Claims, 5 Drawing Sheets

(Continued)

(1 of 5 Drawing Sheet(s) Filed in Color)

(51) Int. Cl.
  *H01L 21/02* (2006.01)
  *H01L 21/3063* (2006.01)
  *H01L 21/306* (2006.01)
  *C23F 1/00* (2006.01)
(52) U.S. Cl.
  CPC .... *H01L 21/02601* (2013.01); *H01L 21/3063* (2013.01); *H01L 21/30604* (2013.01)
(58) Field of Classification Search
  USPC .......................................................... 438/707
  See application file for complete search history.

(56) References Cited

U.S. PATENT DOCUMENTS

| | | |
|---|---|---|
| 2004/0214085 A1 | 10/2004 | Sheem et al. |
| 2008/0260839 A1 | 10/2008 | Canham et al. |
| 2009/0186267 A1 | 7/2009 | Tiegs |
| 2016/0308205 A1 | 10/2016 | Canham et al. |

OTHER PUBLICATIONS

Chadwick et al. "Microstructural characterization of Metallurgical Grade Porous Silicon Nanosponge Particles", Journal of Materials Science, 47, 2396-2404, Springer Science & Business Media B.V. (2011).
Dudley et al., "Stain Etching with Fe(III), V(V), and Ce(IV) to Form Microporous Silicon", Electrochemical and Solid-State Letters, 12(4), D22-D26, The Electrochemical Society (2009).
Fontana et al., "Platelet Lysate-Modified Porous Silicon Microparticles for Enhanced Cell Proliferation in Wound Healing Applications", Applied Materials & Interfaces, 8, 988-996, American Chemical Society (2015).
Kolasinski et al., "Laser Assisted and Wet Chemical Etching of Silicon Nanostructures", J. Vac. Sci. Technol., 24(4), 1474-1479, American Vacuum Society (2006).
Kolasinski et al., "Regenerative Electroless Etching of Silicon", Communications, 56, 624-627, Angewandte Chemie (2016).
Kolasinski et al., "The Stoichiometry of Electroless Silicon Etching in Solutions of V2O5 and HF", Angewandte Communications, 52, 6731-6734, Angewandte Chemie (2013).
Kolasinski, "Charge Transfer and Nanostructure Formation During Electroless Etching of Silicon", Journal of Physical Chemistry, 114(50), 22098-22105, American Chemical Society (2010).
Kolasinski, "Test of Marcus Theory Predictions for Electroless Etching of Silicon", Journal of Physical Chemistry, 116, 472-481, American Chemical Society (2012).
Li et al. "Black Metallurgical Silicon for Solar Energy Conversion", Semiconductor Science and Technology, 31, 1-15, IOP Publishing (2016).
Limaye et al., "Scaleable Synthesis Route for Silicon Nanocrystal Assemblies", Physica Status Solidi, 204, 1297-1301, Wiley-VCH Verlag GmbH (2007).
Loni et al., "Extremely High Surface Area Metallurgical-Grade Porous Silicon Powder Prepared by Metal-Assisted Etching", Electrochemical and Solid-State Letters, 14 (5), K25-K27, The Electrochemical Society (2011).
Nahidi et al., "Effects of Stain Etchant Composition on the Photoluminescence and Morphology of Porous Silicon", Journal of the Electrochemical Society, 153 (1), C19-C26, The Electrochemical Society, Inc. (2006).
Santos et al. "Multifunctional Porous Silicon for Therapeutic Drug Delivery and Imaging", Current Drug Discovery Technologies, 8, 228-249, Bentham Science Publishers (Jan. 2011).
Sarparanta et al., "F-Labeled Modified Porous Silicon Particles for Investigation of Drug Delivery Carrier Distribution in Vivo with Positron Emission Tomography", Molecular Pharmaceutics, 1799-1806, ACS Publications, the American Chemical Society (2011).
Wang et al., "Multifunctional Porous Silicon Nanoparticles for Cancer Theranostics", Biomaterials, 108-118, Elsevier (2015).
Wang et al., "Stain Etched Nanostructured Porous Silicon: The Role of Morphology on Antibacterial Drug Loading and Release", Silicon, 525-531, Springer (2016).
Zhang et al., "Fabrication of a Multifunctional Nano-in-Micro Drug Delivery Platform by Microfluidic Templated Encapsulation of Porous Silicon in Polymer Matrix", Advanced Materials, 26, 4497-4503, Wiley-Vch Verlag GmbH (2014).

REGENERATIVE ELECTROLESS ETCHING

RELATED APPLICATION

This application claims the benefit of priority to U.S. Provisional Patent Application Ser. No. 62/595,116, filed on Dec. 6, 2017, the contents of which are incorporated in this application by reference.

TECHNICAL FIELD

The present technology is generally related to a method for producing nanostructured semiconductors. In particular, the technology is related to porous silicon particles, pillared silicon particles, and hierarchical porous silicon particles prepared from electronics-grade, metallurgical-grade, or other silicon-comprising powders.

BACKGROUND OF THE TECHNOLOGY

Applications of nanostructured semiconductors can be economically pursued with the use of semiconductor-grade wafers as a source of silicon if the product can be produced in no other way, e.g., integrated circuits, or if the product cost is not a factor, e.g., highly specialized applications such as aerospace, deep space, military, and some medical applications. However, numerous applications of nanostructured semiconductors, e.g., consumer products, high-energy materials, lighting, secondary (e.g., lithium ion) batteries, sensors, and thermoelectric materials, would benefit from economical production of porous powder on the kilogram to ton scale. Porous silicon in particular has been demonstrated to have especially appealing properties to be used in theranostics (Wang, C.-F., Sarparanta, M. P., Mäkilä, E. M., Hyvonen, M. L. K., Laakkonen, P. M., Salonen, J. J., Hirvonen, J. T., Airaksinen, A. J. & Santos, H. A., Multifunctional porous silicon nanoparticles for cancer theranostics, *Biomaterials*, 48, 108-18 (2015)), nanomedicine (Fontana, F., Mori, M., Riva, F., Mäkilä, E., Liu, D., Salonen, J., Nicoletti, G., Hirvonen, J., Caramella, C. & Santos, H. A, Platelet Lysate-Modified Porous Silicon Microparticles for Enhanced Cell Proliferation in Wound Healing Applications, *ACS Appl Mater Interfaces*, 8, 988-96 (2016)), drug delivery (Zhang, H., Liu, D., Shahbazi, M.-A., Mäkilä, E., Herranz-Blanco, B., Salonen, J., Hirvonen, J. & Santos, H. A., Fabrication of a multifunctional nano-in-micro drug delivery platform by microfluidic templated encapsulation of porous silicon in polymer matrix, *Adv. Mater.*, 26, 4497-4503 (2014)), and biomedical imaging (Santos, H. A., Bimbo, L. M., Lehto, V.-P., Airaksinen, A. J., Salonen, J. & Hirvonen, J., Multifunctional Porous Silicon for Therapeutic Drug Delivery and Imaging, *Current Drug Discovery Technologies*, 8, 228-49 (2011)), if only the porous silicon can be made in bulk quantities.

Electroless etching of metallurgical-grade Si ($1 kg$^{-1}$ versus $10,000 kg$^{-1}$ for semiconductor-grade Si) is recognized as a process with tremendous industrial potential but only if issues related to reproducibility, controllability, purity, cost, and scaling can be addressed. Li, X., Lee, J.-H., Sprafke, A. N. & Wehrspohn, R. B., Black metallurgical silicon for solar energy conversion, *Semicond. Sci. Technol.*, 31, 014009 (2016); Chadwick, E. G., Mogili, N. V. V., O'Dwyer, C., Moore, J. D., Fletcher, J. S., Laffir, F., Armstrong, G. & Tanner, D. A., Compositional characterisation of metallurgical grade silicon and porous silicon nanosponge particles, *Rsc Adv*, 3, 19393-402 (2013); and Loni, A., Barwick, D., Batchelor, L., Tunbridge, J., Han, Y., Li, Z. Y. & Canham, L. T., Extremely High Surface Area Metallurgical-Grade Porous Silicon Powder Prepared by Metal-Assisted Etching, *Electrochem. Solid State Lett.*, 14, K25-K27 (2011). $HNO_3$-based processes suffer from an inability to produce specific surface areas greater than 150 m$^2$ g$^{-1}$, incomplete etching of particles, and a yield of 5%. Chadwick et al. (2013); Chadwick, E. G., Beloshapkin, S. & Tanner, D. A., Microstructural characterisation of metallurgical grade porous silicon nanosponge particles, *J. Mater. Sci.*, 47, 2396-2404 (2012); and Limaye, S., Subramanian, S., Goller, B., Diener, J. & Kovalev, D., Scaleable synthesis route for silicon nanocrystal assemblies, *Phys. Status Solidi A*, 204, 1297-1301 (2007).

A major advance in stain etching was the discovery by Kurt W. Kolasinski and co-workers (Nahidi, M. & Kolasinski, K. W., The effects of stain etchant composition on the photoluminescence and morphology of porous silicon, *J. Electrochem. Soc.*, 153, C19-C26 (2006); and Dudley, M. E. & Kolasinski, K. W., Stain etching with Fe(III), V(V) and Ce(IV) to form microporous silicon, *Electrochem. Solid State Lett.*, 12, D22-D26 (2009)) that $HNO_3$ could be replaced by oxidants that produce significantly less gas during etching. Replacement of $HNO_3$ by $Fe^{3+}$ led to production of powders with much greater specific surface area (up to 408 m$^2$ g$^{-1}$) and improved yield ($\eta \leq 0.24$, defined as the ratio of final mass to initial mass). Loni et al. (2011); Wang, M., Hartman, P. S., Loni, A., Canham, L. T. & Coffer, J. L., Stain Etched Nanostructured Porous Silicon: The Role of Morphology on Antibacterial Drug Loading and Release, *Silicon*, 8, 525-31 (2016). Such replacement failed to resolve, however, issues with process control (particularly regarding thermal budget, drying, and salt precipitation, see U.S. Pat. No. 9,540,246) and cost. Kolasinski and co-workers further demonstrated that $V_2O_5$, which is not a metal salt but an oxide, dissolved in HF etches Si without a concentration threshold, without an induction time, that the oxidant it produces in solution is optimally coupled to the Si valence band for maximum etch rate, and that with control of gas production rate and drying conditions homogeneous films of roughly 20 µm depth could be obtained on etched wafers. Kolasinski, K. W., Gogola, J. W. & Barclay, W. B., A test of Marcus theory predictions for electroless etching of silicon, *J. Phys. Chem. C*, 116, 21472-81 (2012); Kolasinski, K. W., Charge Transfer and Nanostructure Formation During Electroless Etching of Silicon, *J. Phys. Chem. C*, 114, 22098-05 (2010); and Dudley et al. (2009).

In U.S. Patent Application Publication No. 2004/0166319, Li et al. describe a porous silicon powder comprising individual silicon particles wherein only the outermost layer of each individual particle is porous. The porous layer has a maximum thickness of only 500 nm. Farrell et al. report, in International Patent Application Publication No. WO 2007/037787, etching porous silicon particles that comprise a solid core surrounded by a porous silicon layer having a thickness greater than about 0.5 microns. In the disclosed processes a stain etching method is used. In neither of these patent references were the porous silicon particles etched completely to the core.

In U.S. Patent Application Publication No. 2009/0186267, Tiegs describes using the method of Farrell et al. to produce an anode in a lithium ion battery. Canham and Aston disclose, in U.S. Patent Application Publication No. 2008/0260839, performing stain etching after lithographic patterning of a silicon wafer to produce porous silicon cubic particles. Sheem et al. (U.S. Patent Application Publication No. 2004/0214085) and Canham and Friend (U.S. Patent Application Publication No. 2016/0308205) produced non-luminescent porous silicon particles by acid leaching of the metal component, e.g., Al, of a metal/silicon alloy particle. A family of patents obtained by Green et al. (e.g., U.S. Pat. No. 9,184,438 and related EP Patent No. 2 321 441) disclose having produced pillared silicon particles by metal-assisted catalytic etching (MACE) of silicon powders in which the pillars are crystalline.

SUMMARY OF THE INVENTION

The present invention meets the need for an improved process for producing high specific surface area (up to 888 $m^2 \, g^{-1}$) tuneably photoluminescent porous Si (por-Si). In certain embodiments, the invention uses a catalytic amount of $V_2O_5$ dissolved in an aqueous solution HF with or without addition of acetic acid. Dissolution of $V_2O_5$ produces a V species in the +5 oxidation state also denoted V(V), which is believed to be $VO_2^+$. This V species acts as the primary oxidant $Ox_1$ that injects holes into the Si valence band, a necessary condition for nanostructuring. $VO_2^+$ is an optimal oxidant for the initiation of Si electroless etching. Kolasinski et al. have shown that the rate of etching induced by $VO_2^+$ exceeds the etch rate induced by $H_2O_2$ by more than a factor of 4,000. Kolasinski, K. W., Gimbar, N. J., Yu, H., Aindow, M., Mäkilä, E. & Salonen, J., Regenerative Electroless Etching of Silicon, *Angew. Chem., Int. Ed. Engl.*, 56, 624-27 (2017). The oxidant initiates etching by removing an electron from silicon, a process that is also called hole injection into the silicon valence band. Kolasinski, K. W. & Barclay, W. B., The Stoichiometry of Electroless Silicon Etching in Solutions of $V_2O_5$ and HF, *Angew. Chem., Int. Ed. Engl.*, 52, 6731-34 (2013). Importantly, the improved process allows the use of $H_2O_2$ (~$0.5 \, kg^{-1}$), an oxidant that is known not to produce porous Si in the absence of a metal particle catalyst, in place of the vast majority of $V_2O_5$ (~$50 \, kg^{-1}$), which simultaneously enhances economic viability and process control by facilitating easier thermal management, greater control over the etch rate, and elimination of precipitation of impurities onto the porous powder.

More generally, disclosed is a process of electroless etching to produce porosified, pillared, or hierarchical silicon particles. The process includes the steps of: (a) providing electronics-grade, metallurgical-grade, or other silicon-comprising powders; (b) adding a first oxidant; (c) using the first oxidant to regenerate a second oxidant; and (d) initiating through the second oxidant nano structure formation.

It is to be understood that both the foregoing general description and the following detailed description are exemplary, but are not restrictive, of the disclosure.

BRIEF DESCRIPTION OF THE DRAWING

The patent or application file contains at least one drawing executed in color. Copies of this patent or patent application publication with color drawing(s) will be provided by the Office upon request and payment of the necessary fee. The invention is best understood from the following detailed description when read in connection with the accompanying drawing. Included in the drawing are the following figures.

DETAILED DESCRIPTION OF THE DISCLOSURE

Semiconductor dissolution and nanostructuring initiated by valence band hole injection is not limited to silicon but is a general process applicable to other semiconductors. Similarly, the chemical identities of $Ox_1$ and $Ox_2$ are not restricted to $VO_2^+$ and $H_2O_2$. Rather, $Ox_1$ and $Ox_2$ may be taken from any pair of oxidants, which have a positive standard reduction potential and for which $Ox_2$ is more positive than $Ox_1$. Potential oxidants include, but are not limited to, $VO_2^+$, $H_2O_2$, $Ce^{4+}$, nitrates (including $HNO_3$ and $Fe(NO_3)_3$), nitrites, $NO_2$, $NOBF_4$, $NOHSO_4$, $MnO_4^-$, dihalogens (e.g., $Br_2$ and $I_2$), halogenates (e.g., $IO_3^-$), $IrCl_6^{2-}$, $Fe^{3+}$, $S_2O_8^{2-}$, $HCrO_4^-$, $ClO_4^-$, $Co^{3+}$, $Ru(CN)_6^{3-}$, and $UO_2^+$. Metals (and their associated solution phase ions) such as Cu, Ag, Au, Rh, Pd, Pt, Hg, and Tl that will plate out onto Si are excluded from the list as their plating behavior leads to metal-assisted catalyzed etching (MACE), which is a chemically distinct etching method (see, e.g., U.S. Pat. No. 6,790,785 issued to Li, Bohn, and Sweedler). For example, the inventors have performed etching on silicon carbide (SiC) with both $VO_2^+$ and $MnO_4$ as the oxidant to initiate etching and create luminescence centers.

A number of semiconductors have a valence band maximum (VBM) that lies at or is less positive than an electrochemical potential of 1.7 V versus the standard hydrogen electrode (SHE), which is equal to the standard electrode potential of $Ce^{4+}$ but less positive than that of $H_2O_2$. Such a positioning of the valence band maximum facilitates rapid hole injection from a suitable oxidant and the initiation of electroless etching. Therefore, the process described in this document can in principle be used to produce porosified, pillared, and hierarchical semiconductors in, e.g., silicon, silicon carbide, GaAs, GaP, CdS, CdSe, $MoS_2$, $Cu_2O$, $Ce_2O_3$, $InVO_4$, $Ta_2N_5$, $SnS_2$, $Sb_2S_3$, ZnSe, $Ce_2S_3$, $In_2S_3$, PbS, $Sb_2S_3$, CdTe, and $Sb_2Se_3$ from electronics-grade, metallurgical-grade, or other silicon-comprising or semiconductor-comprising powders. Similarly, although the specific examples described below pertain to substrates that comprise silicon, the process is general to all semiconductors and semiconductor-comprising powders with an appropriately positioned valence band maximum.

It is the position of the valence band maximum with respect to the Nernstian potential of the oxidant $E_{ox}$ that is important. The Nernst equation, $E_{ox}=E°-(RT/zF)\ln Q$, defines this potential in terms of the standard potential $E°$, gas constant R, temperature T, electron number z, Faraday constant F, and reaction quotient Q. Therefore, the Nernstian potential of the oxidant depends both on the choice of oxidant and control of the reaction conditions through Q.

Figure 1:
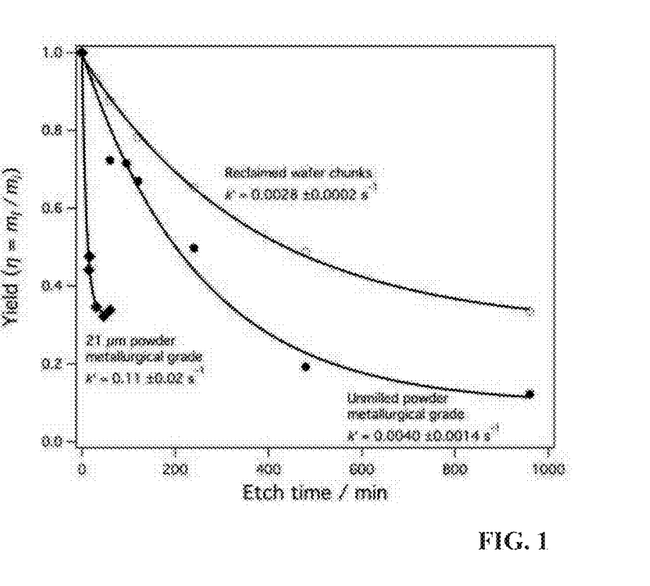
FIG. 1 is a graph illustrating that the etching of silicon powders follows pseudo-first order kinetics regardless of the crystallinity and size of silicon particles.

FIG. 1 demonstrates the well-behaved kinetics of Si etched electrolessly in $V_2O_5$+HF aqueous solutions at 0° C. Three different types of Si were etched to produce the data in FIG. 1: crushed wafer reclaim (irregular rectangular shards hundreds of μm across), un-milled metallurgical-grade powder (irregular rectangular particles broadly distributed about 500 μm and above), and milled metallurgical-grade Si with a roughly Gaussian size distribution centered about 21 μm. All three exhibit pseudo-first-order kinetics. Si wafer etching in $V_2O_5$+HF is first order in $V_2O_5$ with a flat etch front. The results in FIG. 1 together with the prior results of Kolasinski et al. on wafers and laser ablation pillars, Kolasinski, K. W., Mills, D. & Nahidi, M., Laser Assisted and Wet Chemical Etching of Silicon Nanostructures, *J. Vac. Sci. Technol. A*, 24, 1474-79 (2006), demonstrate that electroless etching can be used on substrates of arbitrary crystallinity, shape, and size. Stain etching of powders and wafers follows the same etch dynamics even with the presence of impurities and polycrystallinity.

Nonetheless, powder etching is much faster than wafer etching. Any etch process is characterized by certain properties, including the etch rate, which is the amount of material removed during a defined period of time. The true rate constant for etching of the 21 μm powder is $k=0.45±0.08$ $m^{-2}$ $s^{-1}$ at 273° K. Using the measured activation energy of 30±5 kJ $mol^{-1}$ for single-crystal Si to adjust a value obtained at 298° K., Kolasinski et al. (2013), the true rate constant for etching Si wafers is $k=0.036±0.010$ $m^{-2}$ $s^{-1}$ at 273° K. The presence of defects in metallurgical-grade Si powder increased the etch rate by roughly one order of magnitude compared to wafer Si.

The stain etching procedure taught by Li et al. and Farrell et al. produces initially visibly photoluminescent porous silicon. Upon exposure to the atmosphere the powders exhibit photoluminescence (PL) in the orange region of the spectrum. However, the PL intensity decreases over the course of several days and redshifts to the range 650-700 nm. It finally stabilizes after approximately one week. Scanning electron microscopy (SEM) and transmission electron microscopy (TEM) reveal the cause of moderate specific surface area and PL fading. Only a thin layer of porous Si surrounds a solid core. This layer is fragile, which makes the PL unstable. The solid core reduces the yield of porous silicon as well as the porosity and specific surface area of the etched powder.

Under optimal conditions etching occurs only at the pore tips, particle size is constant, and the volume etched equals the pore volume. The ratio of pore volume to particle volume defines the porosity E. The fraction of remaining Si is defined by the mass loss ratio (MLR), which is one minus the yield, or MLR=1−η. The optimal etch parameter, OEP, is defined as the ratio of porosity E to MLR. An optimal etch corresponds to OEP=1, which means that all etching leads to pore formation rather than particle dissolution. With OEP≈0.4, the powders produced with etches reported in FIG. 1, i.e., stoichiometric $V_2O_5$ added at the beginning of the etch, were significantly better than $HNO_3$ etching with OEP≈0.3.

To perform etching more efficiently and with greater versatility, a totally new etch process is introduced, which can be called regenerative electroless etching (ReEtching). ReEtching allows control of the rate and the amount of etching independent of the amount of $V_2O_5$ added. A catalytic amount of $V_2O_5$ is added to HF. Typically 0.05-0.5 g is used, compared to the 6.5 g required by stoichiometry to etch 1 g of Si. After initiation of etching by mixing of $V_2O_5$+HF with Si dispersed in HF+$H_2O$, $H_2O_2$ is added via a syringe pump. $H_2O_2$ regenerates the V(V) species that initiates electroless etching. The injection rate of $H_2O_2$ controls the rate of etching. The amount of Si etched is controlled by the amount of $H_2O_2$ added. This allows the process to replace 95% or more of the 100× more expensive $V_2O_5$ with less expensive $H_2O_2$. Slow continuous addition of $H_2O_2$ reduces the thermal load on the system and produces a steady state etch rate that allows for film formation with minimal electropolishing.

ReEtching with the $V_2O_5$+$H_2O_2$ couple is possible because the V(V) species that initiates etching is converted quantitatively to V(IV) when it extracts an electron from the silicon valence band. Kolasinski et al. (2013). The associated standard reduction potentials are $E°(VO_2^+/VO^{2+})$ =0.991 V and $E°(H_2O_2/H_2O)$=1.776 V, respectively. $H_2O_2$ regenerates an V(V) ion in solution, which is capable of injecting holes into the Si valence band when it is added to an V(IV)-containing solution. Scaling of the process to large batches is made much easier because the thermal load is greatly reduced by the controlled steady-state etch rate achieved by regulated addition of $H_2O_2$. Furthermore, vanadium-containing ions exhibit higher solubility than the ferric/ferrous system and $H_2O_2$ does not add precipitating ions. No precipitates are formed.

Figure 2:
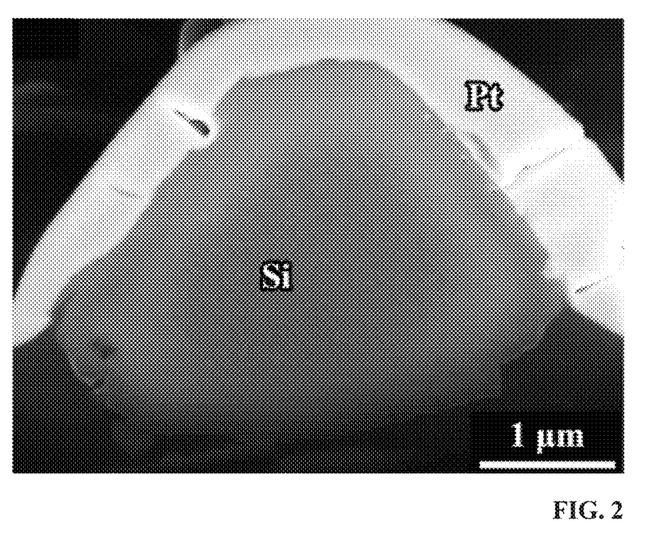
FIG. 2 is a secondary electron (SE) scanning electron microscopy (SEM) image of focused ion beam (FIB)-sectioned ~4 μm powder etched in $V_2O_5+H_2O_2+HF$, revealing that the particle is porosified to the core.
Figure 3:
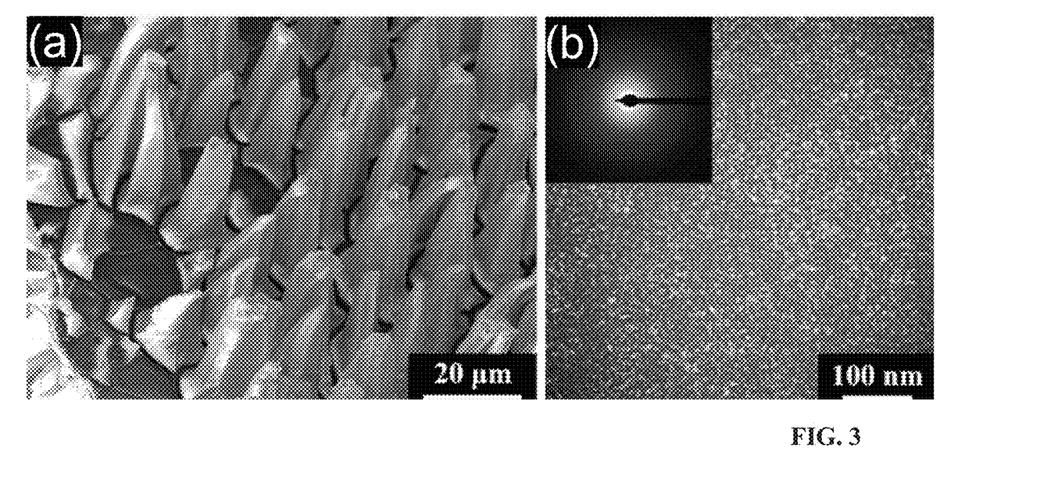
FIG. 3(a) is a SE SEM image revealing >20 μm tall pillars etched into an approximately 1 mm powder particle during ReEtching for 6 hours.
FIG. 3(b) is a bright field (BF) transmission electron microscopy (TEM) image obtained from a single pillar revealing it to be porous with a high tortuosity, and the selected area diffraction pattern (inset) reveals it to be totally amorphous (the region below the pillars was porous to a depth extending over 2 μm)

The ReEtching process can fully porosify 4 μm metallurgical-grade Si powder as demonstrated by TEM in FIG. 2. Such particles are composed of nanocrystalline porous silicon. Electron diffraction revealed no amorphitization or pore collapse resulting from pentane drying or the ReEtch process. No previous method or process has demonstrated an ability to fully porosify Si particles. ReEtching allows the greatest specific area values reported from the etching of metallurgical-grade silicon powder by Li et al and Farrell et al. to be exceeded. The ReEtching process has achieved specific surface areas over 400 $m^2$ $g^{-1}$ from metallurgical-grade powder and as high as 888 $m^2$ $g^{-1}$ when ReEtching anodized porous powder. ReEtching also allows the etching of porous layers >20 μm thick. Depending on the etching and drying conditions, such layers can result in the formation of amorphous silicon pillars that are >1 μm in height. As shown in FIG. 3, amorphous pillars with >20 μm height have been produced. The TEM image in FIG. 3 also reveals the tortuous porous structure of these pillars.

This procedure involves use of HF and a highly exothermic reaction of a strong oxidant with Si powder. Appropriate safety measures and labware must be used to address the toxic and corrosive nature of HF. Appropriate thermal management must be incorporated to address the heat generated by the reaction.

The etchant is formulated either with a 1:1 dilution of 48% HF:$H_2O$ (when a syringe pump was used) or 1:2 dilution (for data in FIG. 1). The initial concentration (based on $V_2O_5$) was 0.57 M (FIG. 1) or 0.01-0.06 M for syringe pump experiments. When acetic acid is added, the volume of water is reduced proportionately. A typical etch for 1 g of Si powder without acetic acid is performed in a mixture of 20 ml of concentrated HF+20 ml deionized and distilled $H_2O$.

The order of mixing is important. $V_2O_5$ dissolves easily and slightly exothermically in room temperature 48% HF but extremely slowly in cold dilute HF. Typically, therefore, $V_2O_5$ is dissolved in 10 ml of HF, which is then diluted with 10 ml of $H_2O$. This solution is chilled to 0° C. while sparging with Ar. Si powder is dispersed in 10 ml of $H_2O$. Subsequently 10 ml of HF is added to this mixture with stirring bar agitation. The suspension is then chilled to 0° C. while sparging with Ar. After 15 minutes, the etching is begun by adding the $V_2O_5$ solution to the Si suspension. When $H_2O_2$ is used, the injection begins 5 minutes after mixing of the solution with the suspension, and the flow rate is adjusted to deliver the desired amount of $H_2O_2$ over the period that ends 5 minutes before the end of the overall etch process.

After the etch process was completed, filtration was performed with a Büchner-style funnel. The filter was chosen to retain >1 µm particles. While in the filter funnel, the sample was rinsed with 0.2 M HCl(aq), then pentane. Sometimes an ethanol rinse between the acid and pentane rinses was performed. The sample was then removed to either a desiccator or vacuum oven and dried under vacuum.

The specific surface area (SSA) and total pore volume of the porous Si samples were determined with $N_2$ sorption measurements at −196° C. using a Micromeritics TriStar 3000. The SSA was calculated from the adsorption isotherm using Brunauer-Emmett-Teller (BET) analysis, while the pore volume was obtained from the total adsorbed amount at a relative pressure of 0.97 using the Barrett-Joyner-Halenda (BJH) theory.

Specific surface area increased with longer etch times but was reduced if a superstoichiometric amount of $H_2O_2$ was added. The addition of acetic acid (volume ratios of acetic acid:water:HF of 1:3:4) significantly increased the specific surface area and OEP. Acetic acid is a surfactant that decreased the etch rate while enhancing the release of $H_2$ bubbles and replacement of etchant during rinsing. Porous particles in solution are denser in the presence of acetic acid as evidenced by reduced foaming and floating because the pores contain less gas. Less gas and more etchant in the pores enhances etching at the pore tip relative to etching of the external surface. Therefore, the OEP value was improved. The use of acetic acid and particle sizes ≥20 µm reduces foaming and concomitant etch inhomogeneities significantly. Li et al. and Farrell et al. were limited to using small particle sizes, usually 4 µm, because of the thinness of their porous films and the low yield associated with larger particles. The ReEtch process is unencumbered by such limitations.

Figure 4:
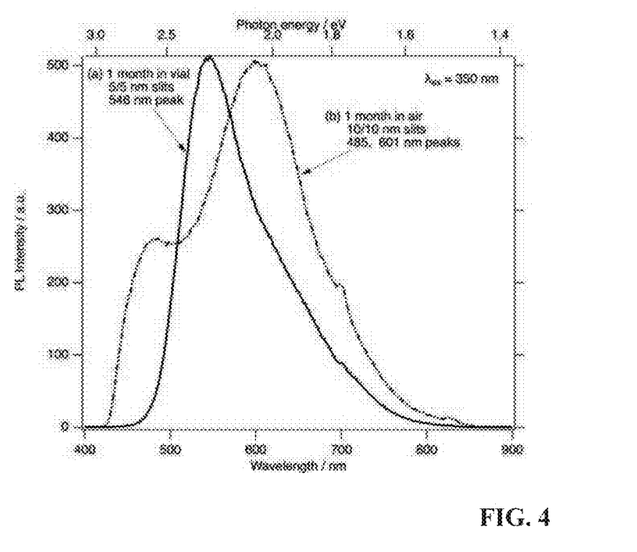
FIG. 4 is a graph illustrating photoluminescence acquired with excitation at 350 nm from ReEtched porous Si powder, with the spectrum (a) showing photoluminescence acquired after the sample was kept for approximately 1 month in a sealed glass vial and the spectrum (b) showing photoluminescence from the same sample after it was exposed to laboratory air for 1 month after the first measurement (a filter that cuts on at 430 nm exaggerates the sharpness of the rising edge on the blue side of spectrum (b))

ReEtching can be applied to other starting materials including wafers, laser-ablation textured wafers, and porous Si powder produced by magnesio-thermal reduction, or to pulverization of anodized wafers. Application of ReEtching to porous Si powders has allowed production of a new type of hierarchical porous silicon, which can be called ReEtched anodized porous silicon or RaPSi. RaPSi is produced by first creating non-luminescent porous silicon through conventional anodization of a silicon wafer. The porosified layer is then pulverized by mechanical ball milling as described in the method of Salonen described in Wang et al. (2015) and in Sarparanta, M., Mäkilä, E., Heikkilä, T., Salonen, J., Kukk, E., Lehto, V.-P., Santos, H. A., Hirvonen, J. & Airaksinen, A. J., F-labeled modified porous silicon particles for investigation of drug delivery carrier distribution in vivo with positron emission tomography. *Mol. Pharm.*, 8, 1799-1806 (2011). The powdered porous silicon thus produced is then subjected to the ReEtch process. The product of the RaPSi process is a high surface area powder that is brilliantly photoluminescent in the visible. FIG. 4 displays two representative spectra of RaPSi PL after storage in a sealed container and after atmospheric exposure. Air exposure led to significant PL intensity in a blue band at ~485 nm in addition to the yellow-orange band at ~610 nm.

Figure 5:
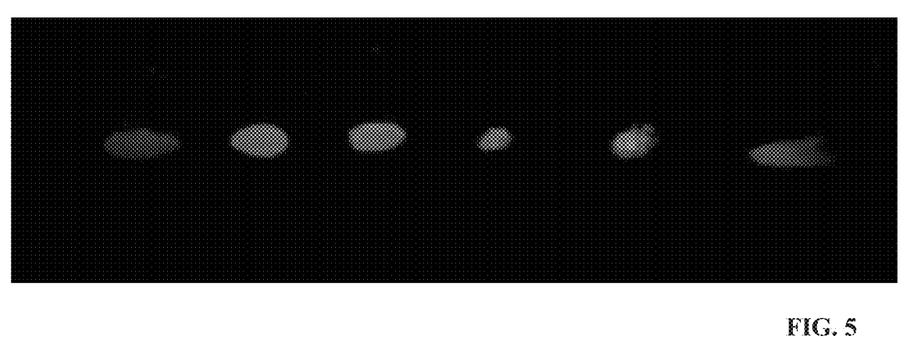
FIG. 5 shows photoluminescence excited with 350 nm provided by a hand-held UV lamp from ReEtched porous Si powder (tuning of the apparent color of the luminescence is achieved by changing ReEtch parameters).

The peak photoluminescence wavelength and apparent color of ReEtched porous Si also responds to the etch conditions. ReEtched porous silicon retains significantly more PL than conventionally etched porous silicon. Although there is some batch-to-batch variation, a general trend, which is particularly apparent in RaPSi, is that greater mass loss during etching is correlated with bluer emission. As shown in FIG. 5, the apparent color of RaPSi can be shifted from red across the whole of the visible spectrum to green and then blue by increasing the total amount of injected $H_2O_2$ during the ReEtch process. From left to right in FIG. 5, the colors of the six images range from burgundy or dark red (left-most image) to red (second and third images from the left) to a dark shade of yellow-green (third image from the right) to green (second image from the right) to blue (right-most image).

Red is the color at the end of the visible spectrum of light, next to infrared light and opposite ultraviolet light. Red has a dominant wavelength of approximately 625-750 nanometers. Green is approximately in the middle of the visible spectrum of light with a dominant wavelength of approximately 495-570 nanometers. Blue follows green on the spectrum toward ultraviolet light, and has a dominant wavelength of approximately 450-495 nanometers.

EXAMPLES

The following examples are included to more clearly demonstrate the overall nature of the invention. These examples are exemplary, not restrictive, of the invention.

Porous Si samples have been made with reagents from multiple sources, e.g., $V_2O_5$ (Fisher certified grade), HF (Acros Organics 49% ACS reagent), $H_2O_2$ (Acros Organics 35% ACS reagent), and glacial $CH_3COOH$ (Fisher ACS reagent). Si powders (Vesta Sciences or Elkem) and wafer chunks (Union Carbide) were used. The un-milled powder contained mainly rectangular particles with either (Vesta) a largest dimension of at least 500 µm up to 1 mm, or (Elkem) 200-800 µm particles. Referring to FIG. 1, the powder labelled as the 21 µm powder was characterized by a $d_{50}$=21 µm with $d_{10}$=7 µm and $d_{90}$=40 µm. The 4 µm powder was characterized by a $d_{50}$=4.0 µm with $d_{10}$=1 µm and $d_{90}$=8 µm. About $d_{50}$, the distributions are rather narrow and roughly Gaussian with standard deviations of 2 µm and 0.5 µm, respectively. The wafer chunks were composed of long, flat shards that passed through a 710 µm sieve. All etching was performed in Teflon or plastic beakers submerged in an ice/water bath held within an insulating container. The etchant was continuously agitated with a magnetic stirring bar as well as continuous sparging with Ar. Etching of fine powders produced foam that was occasionally disrupted by hand stirring with a Teflon rod.

Example 1

40 ml of etchant was made from a 1:1 dilution of HF with distilled $H_2O$ to which 0.3 g of $V_2O_5$ had been added. 3.5 ml of $H_2O_2$ was added at a constant rate beginning 5 minutes after the Si was mixed with the etchant and ending 5 minutes before the etch was terminated by filtration with a Büchner funnel. A 4 µm powder was etched to 392 $m^2$ $g^{-1}$ specific surface area, 3.2 nm mean pore diameter, 0.312 cm³ pore volume, E=0.421, MLR=0.822, and OEP=0.512 in a 160 minute etch.

Example 2

Replacing a portion of the water used in the etchant with acetic acid is found to increase OEP. For example, a 403 m² g⁻¹ specific surface area, 3.8 nm mean pore diameter, 0.388 cm³ pore volume, E=0.475, MLR=0.658, and OEP=0.721 were achieved in a 90 minute etch by adding 5 ml of concentrated acetic acid.

Example 3

Mesoporous powder produced by anodization was used as the powdered substrate. Ball milling was used to produce a powder of 38-75 μm porous particles with a mean BJH pore diameter of 14 nm. 0.635 g of this non-luminescent powder was ReEtched for 90 minutes with 0.302 g $V_2O_5$ in 40 ml of 4:3:1 HF:$H_2O$:$CH_3COOH$ with 1.2 ml of $H_2O_2$ injected over 80 minutes. This process allowed introduction of much smaller luminescent structures within the walls of the roughly 14 nm mesopores. The result was bright and persistently photoluminescent material. The resulting material is RaPSi. Photoluminescence from this batch of RaPSi is shown in FIG. 4.

Example 4

Mesoporous silicon powder was produced by anodizing p⁺-type Si wafers with a constant current density of 50 mA/cm² in a 1:1 HF:EtOH solution. The porous layer was lifted off the wafer as a free-standing film through an electropolishing current pulse. The porous Si film was ball milled into microparticles of 38-75 μm with a mean BJH pore diameter of 17 nm. An amount of 0.500 g of this non-luminescent powder was ReEtched for 120 minutes with 0.076 g $V_2O_5$ in 40 ml of 4:1:3 HF:$H_2O$:$CH_3COOH$ with 1.5 ml of $H_2O_2$ injected over 110 minutes. This process allowed introduction of much smaller luminescent structures within the walls of the roughly 17 nm mesopores, achieving 888 m² g¹ specific surface area and 3.2 cm³ g⁻¹ pore volume, ε=0.88. The result was stunningly bright and persistent photoluminescent material.

The following numbered paragraphs summarize some of the embodiments of the present invention.

1. Disclosed is a process of producing porosified, pillared, and/or hierarchical silicon comprising particles from electronics-grade, metallurgical-grade, or other silicon-comprising powders in which addition of an oxidant is used to regenerate a second oxidant and in which the second oxidant initiates nanostructure formation. Oxidants include, but are not limited to, $VO_2^+$, $H_2O_2$, $Ce^{4+}$, nitrates including $HNO_3$ and $Fe(NO_3)_3$, nitrites, $NO_2$, $NOBF_4$, $NOHSO_4$, $MnO_4^-$, dihalogens including $Br_2$ and $I_2$, halogenates including $IO_3^-$', $IrCl_6^{2-}$, $Fe^{3+}$, $S_2O_8^{2-}$, $HCrO_4^-$, $ClO_4^-$, $Co^{3+}$, $Ru(CN)_6^{3-}$, or $UO_2^+$.

2. Also disclosed is a process to produce porosified, pillared, and/or hierarchical silicon comprising particles from electronics-grade, metallurgical-grade, or other silicon-comprising powders that exhibit visible to near-infrared luminescence in which addition of an oxidant is used to regenerate a second oxidant and in which the second oxidant initiates nanostructure formation. The oxidants include, but are not limited to, $VO_2^+$, $H_2O_2$, $Ce^{4+}$, nitrates including $HNO_3$ and $Fe(NO_3)_3$, nitrites, $NO_2$, $NOBF_4$, $NOHSO_4$, $MnO_4^-$, dihalogens including $Br_2$ and $I_2$, halogenates including $IO_3^{-1}$, $IrCl_6^{2-}$, $Fe^{3+}$, $S_2O_8^{2-}$, $HCrO_4^-$, $ClO_4^-$, $Co^{3+}$, $Ru(CN)_6^{3-}$, or $UO_2^+$.

3. A process is further disclosed to produce porosified, pillared, and/or hierarchical silicon-comprising particles from electronics-grade, metallurgical-grade, or other silicon-comprising powders in which addition of $H_2O_2$ is used to regenerate a V(V) species and in which the V(V) species initiates nanostructure formation.

4. A process is further disclosed to produce porosified, pillared, and/or hierarchical silicon-comprising particles from electronics-grade, metallurgical-grade, or other silicon-comprising powders that exhibit visible to near-infrared luminescence in which addition of $H_2O_2$ is used to regenerate a V(V) species and in which the V(V) species initiates nanostructure formation.

5. Further disclosed is a process to produce porosified, pillared, and/or hierarchical semiconductor (e.g., silicon, silicon carbide, GaAs, GaP, CdS, CdSe, $MoS_2$, $Cu_2O$, $Ce_2O_3$, $InVO_4$, $Ta_2N_5$, $SnS_2$, $Sb_2S_3$, ZnSe, $Ce_2S_3$, $In_2S_3$, PbS, $Sb_2S_3$, CdTe, or $Sb_2Se_3$) particles from electronics-grade, metallurgical-grade, or other semiconductor-comprising powders in which addition of an oxidant is used to regenerate a second oxidant and in which the second oxidant initiates nanostructure formation.

6. Still further disclosed is a process to produce porosified, pillared, and/or hierarchical semiconductor (e.g., silicon, silicon carbide, GaAs, GaP, CdS, CdSe, $MoS_2$, $Cu_2O$, $Ce_2O_3$, $InVO_4$, $Ta_2N_5$, $SnS_2$, $Sb_2S_3$, ZnSe, $Ce_2S_3$, $In_2S_3$, PbS, $Sb_2S_3$, CdTe, or $Sb_2Se_3$) particles from electronics-grade, metallurgical-grade, or other semiconductor-comprising powders that exhibit visible to near-infrared luminescence in which addition of an oxidant is used to regenerate a second oxidant and in which the second oxidant initiates nanostructure formation.

7. Another disclosed process produces porosified, pillared, and/or hierarchical semiconductor (e.g., silicon, silicon carbide, GaAs, GaP, CdS, CdSe, $MoS_2$, $Cu_2O$, $Ce_2O_3$, $InVO_4$, $Ta_2N_5$, $SnS_2$, $Sb_2S_3$, ZnSe, $Ce_2S_3$, $In_2S_3$, PbS, $Sb_2S_3$, CdTe, or $Sb_2Se_3$) particles from electronics-grade, metallurgical-grade, or other semiconductor-comprising powders in which addition of $H_2O_2$ is used to regenerate a V(V) species and in which the V(V) species initiates nanostructure formation.

8. Yet another disclosed process produces porosified, pillared, and/or hierarchical semiconductor (e.g., silicon, silicon carbide, GaAs, GaP, CdS, CdSe, $MoS_2$, $Cu_2O$, $Ce_2O_3$, $InVO_4$, $Ta_2N_5$, $SnS_2$, $Sb_2S_3$, ZnSe, $Ce_2S_3$, $In_2S_3$, PbS, $Sb_2S_3$, CdTe, or $Sb_2Se_3$) particles from electronics-grade, metallurgical-grade, or other semiconductor-comprising powders that exhibit visible to near-infrared luminescence in which addition of $H_2O_2$ is used to regenerate a V(V) species and in which the V(V) species initiates nanostructure formation.

9. Disclosed is a process according to any one of the preceding numbered summary paragraphs of producing porous silicon powder particles that are porosified completely through for particles with a thickness of smaller than and greater than 4 μm, up to at least 20 μm.

10. Disclosed is a process according to any one of the preceding numbered summary paragraphs of producing porous silicon powders with a porous layer thickness of over 20 μm on each side of a particle for particles with an initial thickness of greater than 20 μm.

11. Disclosed is a process according to any one of the preceding numbered summary paragraphs of producing porous semiconductor powder particles that are porosified completely through for particles with a thickness of smaller than and greater than 4 µm, up to at least 20 µm.

12. Disclosed is a process according to any one of the preceding numbered summary paragraphs of producing porous semiconductor powders with a porous layer thickness of over 20 µm on each side of a particle for particles with an initial thickness of greater than 20 µm.

13. Disclosed is a process according to any one of the preceding numbered summary paragraphs of producing porous silicon-comprising powder particles that are porosified completely through for particles with a thickness of smaller than and greater than 4 µm, up to at least 20 µm.

14. Disclosed is a process according to any one of the preceding numbered summary paragraphs of producing porous silicon-comprising powders with a porous layer thickness of over 20 µm on each side of a particle for particles with an initial thickness of greater than 20 µm.

15. Disclosed is a process according to any one of the preceding numbered summary paragraphs of producing pillared silicon particles in which the silicon pillars are in excess of 1 µm in length and comprise amorphous silicon.

16. Disclosed is a process according to any one of the preceding numbered summary paragraphs of producing pillared semiconductor particles not comprising silicon.

17. Disclosed is a process according to any one of the preceding numbered summary paragraphs of producing hierarchical porous silicon in which anodization is used to create non-luminescent porous silicon, e.g., mesoporous silicon with roughly 17 nm pores, and ReEtching is used to introduce smaller pores within the walls of the larger pores.

18. Disclosed is a process according to any one of the preceding numbered summary paragraphs of producing hierarchical porous silicon in which anodization is used to create non-luminescent porous silicon, e.g., mesoporous silicon with roughly 17 nm pores, and ReEtching is used to introduce luminescence centers.

19. Disclosed is a process according to any one of the preceding numbered summary paragraphs of producing hierarchical porous silicon in which anodization is used to create non-luminescent porous silicon and ReEtching is used to introduce luminescence centers, which can have their luminescence color tuned by variation of the ReEtching parameters including etch time, amount of $Ox_1$, amount of $Ox_2$, and amount of surfactant added as well as post-etching parameters such as drying technique and surface termination.

20. Disclosed is a process according to any one of the preceding numbered summary paragraphs of producing hierarchical porous silicon in which a porous powder, including a powder containing silicon nanowires, is treated with the ReEtch process steps to introduce smaller pores within the walls of the larger pores.

21. Disclosed is a process according to any one of the preceding numbered summary paragraphs of producing hierarchical porous silicon, including a powder containing silicon nanowires, in which a porous powder is treated with the ReEtch process steps to introduce luminescence centers.

22. Disclosed is a process according to any one of the preceding numbered summary paragraphs of producing hierarchical porous silicon in which a porous powder, including a powder containing silicon nanowires, is used in combination with ReEtching to introduce luminescence centers, which can have their luminescence color tuned by variation of the ReEtching parameters including etch time, amount of $Ox_1$, amount of $Ox_2$, and amount of surfactant added as well as post etching parameters such as drying technique and surface termination.

23. Disclosed is a process according to any one of the preceding numbered summary paragraphs of producing hierarchical porous semiconductor in which a porous powder is treated with the ReEtch process steps to introduce smaller pores within the walls of the larger pores.

24. Disclosed is a process according to any one of the preceding numbered summary paragraphs of producing hierarchical porous semiconductor in which a porous powder is treated with the ReEtch process steps to introduce luminescence centers.

25. Disclosed is a process according to any one of the preceding numbered summary paragraphs of producing hierarchical porous semiconductor in which a porous powder is used in combination with ReEtching to introduce luminescence centers, which can have their luminescence color tuned by variation of the ReEtching parameters including etch time, amount of $Ox_1$, amount of $Ox_2$, and amount of surfactant added as well as post-etching parameters such as drying technique and surface termination.

26. Disclosed is a process according to any one of the preceding numbered summary paragraphs of producing porous silicon powders with specific surface areas in the range of 50 to 888 $m^2$ $g^{-1}$, preferably 150 to 888 $m^2$ $g^{-1}$, as measured by the BET method.

27. Disclosed is a process according to any one of the preceding numbered summary paragraphs of producing porous silicon powders with specific pore volumes in the range of 0.15 to 3.2 $cm^3$ $g^{-1}$, as measured by the BET method together with Barrett-Joyner-Halenda (BJH) theory.

28. Disclosed is a process according to any one of the preceding numbered summary paragraphs of producing porous silicon powders with porosities in the range of 0.25 to 0.88, as measured by the BET method together with BJH theory.

29. Also disclosed is a process to produce porosified, pillared, and/or hierarchical silicon-comprising particles from electronics-grade, metallurgical-grade, or other silicon-comprising powders in which continuous addition of an oxidant is used to control the rate of electroless etching, for example, stain etching, ReEtching, or metal assisted catalyzed etching (MACE), independent of the extent of electroless etching. Oxidants include, but are not limited to, $VO_2^+$, $H_2O_2$, $Ce^{4+}$, nitrates including $HNO_3$ and $Fe(NO_3)_3$, nitrites, $NO_2$, $NOBF_4$, $NOHSO_4$, $MnO_4^-$, dihalogens including $Br_2$ and $I_2$, halogenates including $IO_3^{-1}$, $IrCl_6^{2-}$, $Fe^{3+}$, $S_2O_8^{2-}$, $HCrO_4^-$, $ClO_4^-$, $Co^{3+}$, $Ru(CN)_6^{3-}$, or $UO_2^+$.

Although illustrated and described above with reference to certain specific embodiments and examples, the present invention is nevertheless not intended to be limited to the details shown. Rather, various modifications may be made in the details within the scope and range of equivalents of the claims and without departing from the spirit of the invention. It is expressly intended, for example, that all ranges broadly recited in this document include within their scope all narrower ranges which fall within the broader ranges. It is also expressly intended that the steps of the processes disclosed are not restricted to any particular order, unless otherwise noted above.

What is claimed:

1. A process of electroless etching to produce porosified, pillared, or hierarchical silicon particles comprising the steps of:
   (a) providing electronics-grade, metallurgical-grade, or other silicon-comprising powders;
   (b) adding a first oxidant;
   (c) using the first oxidant to regenerate a second oxidant; and (d) initiating through the second oxidant nano structure formation.

2. The process according to claim 1, wherein the first and second oxidants are selected from $VO_2^+$, $H_2O_2$, $Ce^{4+}$, nitrates including $HNO_3$ and $Fe(NO_3)_3$, nitrites, $NO_2$, $NOBF_4$, $NOHSO_4$, $MnO_4^-$, dihalogens including $Br_2$ and $I_2$, halogenates including $IO_3^{-1}$, $IrCl_6^{2-}$, $Fe^{3+}$, $S_2O_8^{2-}$, $HCrO_4^-$, $ClO_4^-$, $Co^{3+}$, $Ru(CN)_6^{3-}$, or $UO_2^+$.

3. The process according to claim 1, wherein the first oxidant is $H_2O_2$ and the second oxidant is a V(V) species.

4. The process according to claim 1, wherein the electronics-grade, metallurgical-grade, or other silicon-comprising powders exhibit visible to near-infrared luminescence.

5. The process according to claim 1, wherein the porosified, pillared, or hierarchical silicon particles produced are selected from silicon, silicon carbide, GaAs, GaP, CdS, CdSe, $MoS_2$, $Cu_2O$, $Ce_2O_3$, $InVO_4$, $Ta_2N_5$, $SnS_2$, $Sb_2S_3$, ZnSe, $Ce_2S_3$, $In_2S_3$, PbS, $Sb_2S_3$, CdTe, or $Sb_2Se_3$.

6. The process according to claim 1, wherein particles are produced that are porosified completely through for particles with a thickness of up to about 20 μm.

7. The process according to claim 1, wherein particles are produced that have a porous layer thickness of over 20 μm on each side of a particle for particles with an initial thickness of greater than 20 μm.

8. The process according to claim 1, wherein pillared silicon particles are produced that have silicon pillars in excess of 1 μm in length and comprise amorphous silicon.

9. The process according to claim 1, wherein hierarchical porous silicon is produced and wherein the process further comprises, before the step (b), the step of anodizing to create non-luminescent porous silicon.

10. The process according to claim 9, wherein the non-luminescent porous silicon is mesoporous silicon with approximately 17 nm pores.

11. The process according to claim 9, wherein steps (b) through (d) introduce luminescence centers or smaller pores within the walls of larger pores.

12. The process according to claim 11, wherein steps (b) through (d) introduce luminescence centers and the process further comprises the step of tuning the luminescence color by varying one or more of etch time, the amount of the first oxidant, the amount of the second oxidant, the amount of surfactant added, and post-etching parameters including drying technique and surface termination.

13. The process according to claim 1, wherein hierarchical porous silicon is produced and wherein the step (a) includes providing a powder containing silicon nanowires.

14. The process according to claim 1, wherein particles are produced that have specific surface areas in the range of 50 to 888 $m^2\ g^{-1}$ as measured by the Brunauer-Emmett-Teller method.

15. The process according to claim 1, wherein particles are produced that have specific pore volumes in the range of 0.15 to 3.2 $cm^3\ g^{-1}$, as measured by the Brunauer-Emmett-Teller method together with Barrett-Joyner-Halenda theory.

16. The process according to claim 1, wherein particles are produced that have porosities in the range of 0.25 to 0.88, as measured by the Brunauer-Emmett-Teller method together with Barrett-Joyner-Halenda theory.

17. A process of electroless etching to produce pillared semiconductor particles not comprising silicon, the process comprising the steps of:
   (a) providing semiconductor powders not comprising silicon;
   (b) adding a first oxidant;
   (c) using the first oxidant to regenerate a second oxidant; and
   (d) initiating through the second oxidant nano structure formation.

18. A process of electroless etching to produce a hierarchical porous semiconductor material comprising the steps of:
   (a) providing porous powders;
   (b) adding a first oxidant;
   (c) using the first oxidant to regenerate a second oxidant; and
   (d) initiating through the second oxidant nano structure formation.

19. The process according to claim 18, wherein steps (b) through (d) introduce luminescence centers or smaller pores within the walls of larger pores.

20. The process according to claim 19, wherein steps (b) through (d) introduce luminescence centers and the process further comprises the step of tuning the luminescence color by varying one or more of etch time, the amount of the first oxidant, the amount of the second oxidant, the amount of surfactant added, and post-etching parameters including drying technique and surface termination.

* * * * *

UNITED STATES PATENT AND TRADEMARK OFFICE
CERTIFICATE OF CORRECTION

| | |
|---|---|
| PATENT NO. | : 10,590,562 B2 |
| APPLICATION NO. | : 16/173800 |
| DATED | : March 17, 2020 |
| INVENTOR(S) | : Kolasinski et al. |

It is certified that error appears in the above-identified patent and that said Letters Patent is hereby corrected as shown below:

In the Specification

At Column 5, Line 58 should read:
defines the porosity $\varepsilon$. The fraction of remaining SI is At Column 5, Line 61 should read:
is defined as the ratio of porosity $\varepsilon$ to MLR. An optimal etch At Column 9, Line 2 should read:
volume, $\varepsilon = 0.421$, MLR $= 0.822$, and OEP $= 0.512$ in a 160

At Column 9, Line 10 should read:
$cm^3$ pore volume, $\varepsilon = 0.475$, MLR $= 0.658$, and OEP $= 0.721$ Signed and Sealed this
Twenty-fourth Day of November, 2020

Andrei Iancu
*Director of the United States Patent and Trademark Office*